(12) United States Patent
Sun et al.

(10) Patent No.: US 11,205,392 B2
(45) Date of Patent: Dec. 21, 2021

(54) BACKLIGHT AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Binhua Sun, Beijing (CN); Ziqiang Guo, Beijing (CN); Jian Sun, Beijing (CN); Feng Zi, Beijing (CN); Yakun Wang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 4 days.

(21) Appl. No.: 16/971,264

(22) PCT Filed: Dec. 23, 2019

(86) PCT No.: PCT/CN2019/127441
§ 371 (c)(1),
(2) Date: Aug. 19, 2020

(87) PCT Pub. No.: WO2020/140786
PCT Pub. Date: Jul. 9, 2020

(65) Prior Publication Data
US 2020/0380923 A1 Dec. 3, 2020

(30) Foreign Application Priority Data

Jan. 2, 2019 (CN) .......................... 201920002867.9

(51) Int. Cl.
*G09G 3/36* (2006.01)
*G09G 3/34* (2006.01)
(Continued)

(52) U.S. Cl.
CPC ..... *G09G 3/3406* (2013.01); *G02F 1/133603* (2013.01); *G09G 3/32* (2013.01); *G09G 2330/00* (2013.01)

(58) Field of Classification Search
CPC .......... G09G 3/3406; G09G 3/34; G09G 3/32; G09G 2330/00; G09G 3/36; G02F 1/133603
See application file for complete search history.

(56) References Cited

U.S. PATENT DOCUMENTS 6,985,124 B1 1/2006 Nogawa
2006/0256050 A1* 11/2006 Ikeda ..................... H05B 45/46
345/82

(Continued)

FOREIGN PATENT DOCUMENTS

CN 101336025 A 12/2008
CN 103137080 A 6/2013
(Continued)

*Primary Examiner* — Pegeman Karimi
(74) *Attorney, Agent, or Firm* — Nath, Goldberg & Meyer; Joshua B. Goldberg

(57) ABSTRACT

The present disclosure provides a blacklight and a display device. The blacklight of the present disclosure includes a backlight driving circuit, which includes a plurality of first signal lines and a plurality of second signal lines, a plurality of light string regions are defined by arranging the plurality of first signal lines and the plurality of second signal lines to cross each other, and a part of the plurality of light string regions are configured to be provided with light emitting diode (LED) light strings; the first terminals of LED light strings in a same row are coupled to a same first signal line, and the second terminals of LED light strings in a same column are coupled to a same second signal line.

20 Claims, 6 Drawing Sheets

(51) Int. Cl.
*G02F 1/13357* (2006.01)
*G09G 3/32* (2016.01)

(56) References Cited

U.S. PATENT DOCUMENTS

| | | | | |
|---|---|---|---|---|
| 2007/0159750 A1* | 7/2007 | Peker | ............ | H05B 45/50 |
| | | | | 361/93.1 |
| 2015/0042925 A1* | 2/2015 | Hu | ............ | G09G 3/3406 |
| | | | | 349/69 |
| 2016/0155417 A1* | 6/2016 | Chen | ............ | G09G 5/10 |
| | | | | 345/690 |
| 2016/0381750 A1* | 12/2016 | Bong | ............ | H01L 25/0753 |
| | | | | 315/201 |
| 2018/0249547 A1* | 8/2018 | Wang | ............ | H05B 45/48 |

FOREIGN PATENT DOCUMENTS

| | | |
|---|---|---|
| CN | 205356729 U | 6/2016 |
| CN | 106033661 A | 10/2016 |
| CN | 107633818 A | 1/2018 |
| CN | 107945748 A | 4/2018 |
| CN | 209070956 U | 7/2019 |

* cited by examiner

BACKLIGHT AND DISPLAY DEVICE

CROSS-REFERENCE TO RELATED APPLICATION

This is a National Phase Application filed under 35 U.S.C. 371 as a national stage of PCT/CN2019/127441, filed Dec. 23, 2019, an application claiming the benefit of Chinese Application No. 201920002867.9, filed Jan. 2, 2019, the content of each of which is hereby incorporated by reference in its entirety.

TECHNICAL FIELD

The present disclosure relates to the field of display technology, and more particularly, to a backlight and a display device.

BACKGROUND

At present, HDR (High-Dynamic Range) images can have more different depths and have a deeper depth of field, and can reflect realistic display scenes, which greatly meets the requirements of the audience. With the development of related technologies, the HDR technology has been used in a display product such as a TV, a tablet, and a VR. However, a liquid crystal display with a special structure, such as a vehicle-mounted display screen and a watch, needs to be provided with a special-shaped direct-lit backlight to achieve the HDR display effect. Since today's display screens have various shapes, it is necessary to provide a backlight with a special-shaped structure.

SUMMARY

The present disclosure provides a blacklight and a display device.

According to a first aspect of the present disclosure, a blacklight including a backlight driving circuit is provided, the backlight driving circuit includes a plurality of first signal lines and a plurality of second signal lines, a plurality of light string regions are defined by arranging the plurality of first signal lines and the plurality of second signal lines to cross each other, and a part of the plurality of light string regions are configured to be provided with light emitting diode (LED) light strings; and the backlight driving circuit further includes at least one switching unit, the at least one switching unit is provided in, among the plurality light string regions, remaining light string regions other than the part of the plurality of light string regions provided with the LED light strings, and the at least one switching unit is coupled between a first signal line and a second signal line and configured to output a voltage signal to the second signal line coupled thereto under control of the first signal line coupled thereto.

In some embodiments, the backlight driving circuit further includes at least one LED driving chip, and output channels of the at least one LED driving chip are coupled to the plurality of second signal lines in one-to-one correspondence.

In some embodiments, the switching unit includes a first capacitor, a first switching transistor, a first resistor, and a second resistor; and a first terminal of the first capacitor is coupled to the first signal line corresponding to the switching unit and a first electrode of the first switching transistor, and a second terminal of the first capacitor is coupled to a first terminal of the first resistor and a control electrode of the first switching transistor; a second electrode of the first switching transistor is coupled to a first terminal of the second resistor; a second terminal of the first resistor is coupled to a ground electrode; and a second terminal of the second resistor is coupled to the second signal line corresponding to the switching unit.

In some embodiments, the backlight driving circuit further includes: a controller, a processor, a power supply, and a plurality of check switch units; and a first terminal of the controller is coupled to a first terminal of the processor and configured to output a vertical synchronization control instruction; a second terminal of the controller is coupled to a second terminal of the processor and configured to output a backlight data control instruction; a third terminal of the processor is coupled to a first terminal of each of the at least one LED driving chip and configured to output a frequency-multiplied vertical synchronization control instruction; a fourth terminal of the processor is coupled to a second terminal of each of the at least one LED driving chip and configured to communicate with the LED driving chip; and the plurality of check switch units are coupled to the plurality of first signal lines in one-to-one correspondence, a first terminal of each of the plurality of check switch units is coupled to the power supply, a second terminal of each of the plurality of check switch units is coupled to a first signal line corresponding to the check switch unit, and a control terminal of each of the plurality of check switch units is coupled to a fifth terminal of the processor.

In some embodiments, the backlight driving circuit includes M second signal lines; the number of the at least one LED driving chip is A; each LED driving chip is provided with B output channels; and where M=A×B, each of A and B is a positive integer greater than or equal to 2.

In some embodiments, each of the plurality of check switch units includes a second switching transistor; and a first electrode of the second switching transistor is coupled to the power supply, a second electrode of the second switching transistor is coupled to a first signal line coupled to the check switch unit, and a control electrode of the second switching transistor is coupled to the fifth terminal of the processor.

In some embodiments, the processor includes a central processor.

In some embodiments, the power supply includes a DC/DC power supply unit.

In some embodiments, the backlight further includes a LED light string provided in each light string region of the part of the plurality of light string regions.

In some embodiments, the first terminals of the LED light strings in a same row are coupled to a same first signal line, and the second terminals of the LED light strings in a same column are coupled to a same second signal line.

In some embodiments, the LED light string includes a plurality of LEDs connected in series; and in the LED light string, an anode of a first LED of the plurality of LEDs is coupled to the first signal line as a first terminal, and a cathode of a last LED of the plurality of LEDs is coupled to the second signal line as a second terminal.

According to some embodiments of the present disclosure, a display device including the backlight described above is provided.

DETAILED DESCRIPTION

In order to provide a full understanding of technical solutions of the present disclosure for those skilled in the art, the present disclosure will be described in detail with reference to the accompanying drawings and the embodiments.

The present embodiment provides a backlight driving circuit, which is suitable for a direct-lit backlight in a special-shaped display panel, for example, a direct-lit backlight in a circular display panel, an oval display panel, or a hexagonal display panel. In this embodiment, a backlight driving circuit applied to a direct-lit backlight of a circular display panel will be described as an example.

Figure 1:
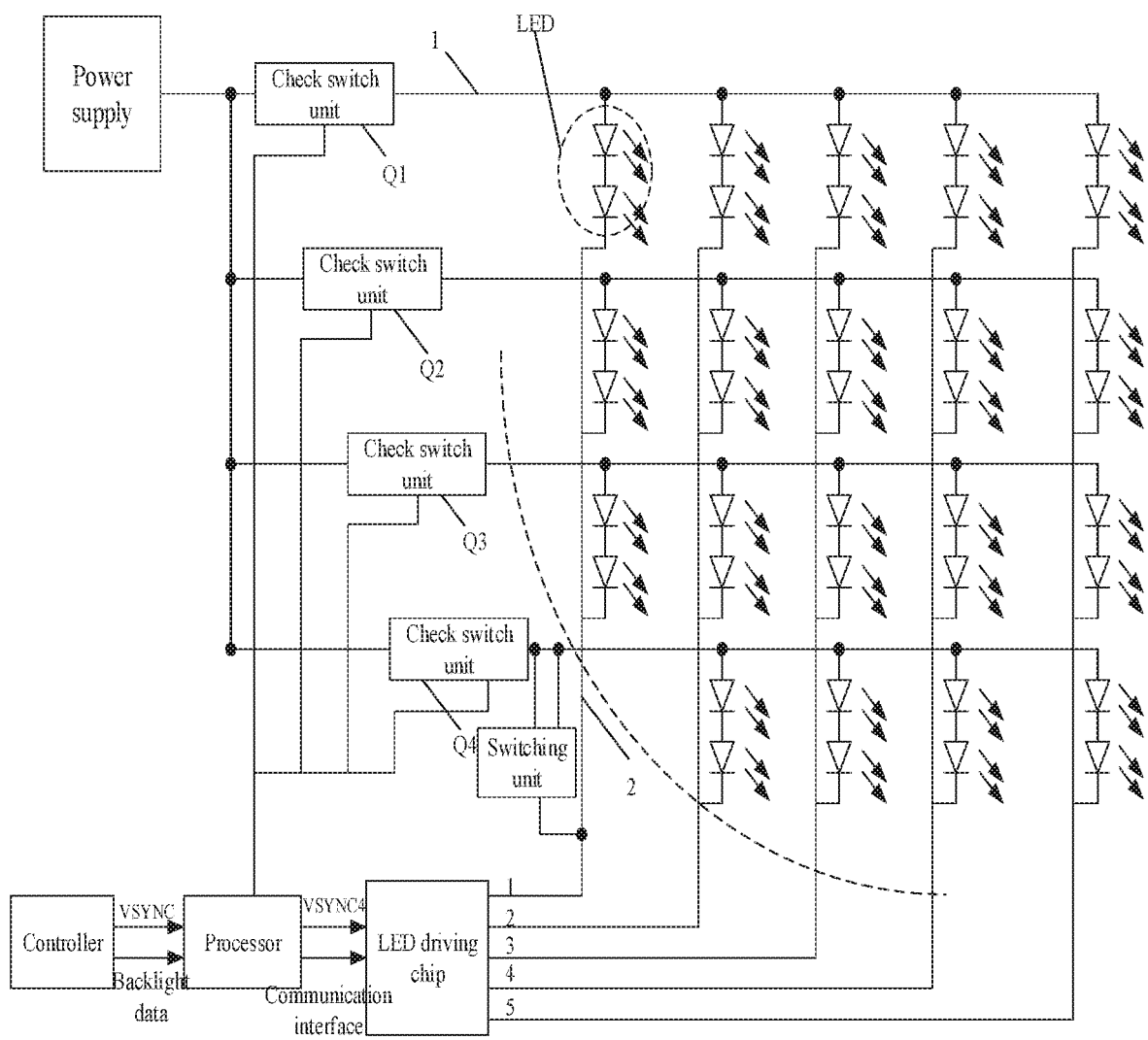
FIGS. 1 and 2 each are a schematic structural diagram of a backlight driving circuit according to some embodiments of the present disclosure.
Figure 2:
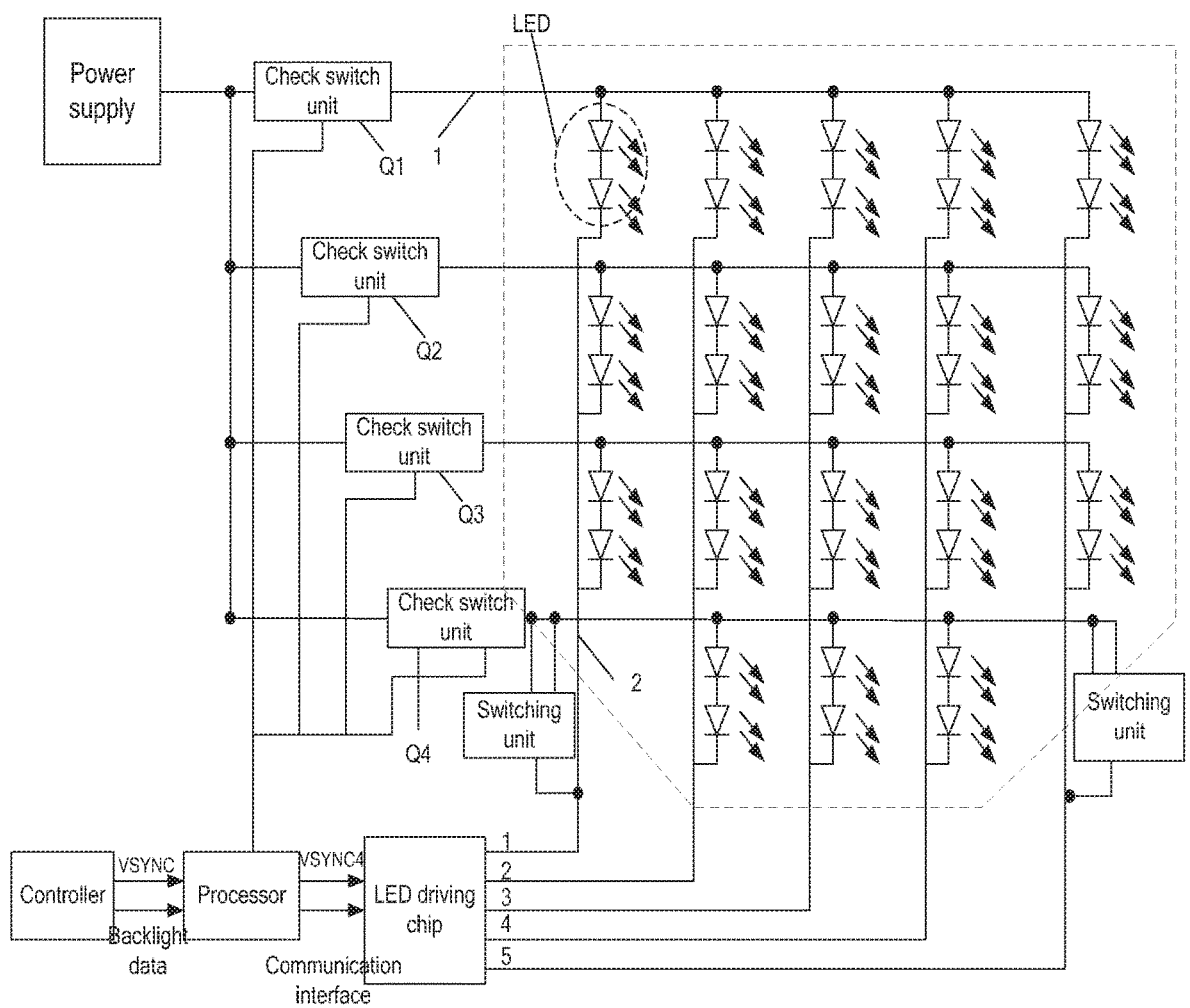

As shown in FIGS. 1 and 2, the backlight driving circuit includes: a plurality of first signal lines 1 and a plurality of second signal lines 2; a plurality of light string regions are defined by arranging the plurality of first signal lines 1 and the plurality of second signal lines 2 to cross each other. Among the plurality of light string regions, light string regions corresponding to a display region of the circular display panel are configured to be provided with light emitting diode (LED) light strings, and remaining light string regions do not need to provide light for the display panel, thus the remaining light string regions are vacant and do not need to be provided with LED light strings. First terminals of LED light strings in light string regions in a same row are coupled to a same first signal line 1; second terminals of LED light strings in light string regions in a same column are coupled to a same second signal line 2.

Particularly, a switching unit is provided between a first signal line 1 and a second signal line 2 corresponding to a light string region in which a LED light string is not provided. For example, as shown in FIG. 1, there is no LED light string in a light string region corresponding to a fourth row and a first column, and a switching unit is coupled between a first signal line 1 in the fourth row and a second signal line 2 in the first column. The switching unit is configured to output a voltage signal to the second signal line coupled thereto wider control of the first signal line coupled thereto, and then to an output channel of an LED driving chip so as to be sensed by the LED driving chip so that LED light strings in a column where the light string region without a LED light string is located can display normally.

Particularly, in an example, a first terminal of the LED light string serves as an anode, and a second terminal thereof serves as a cathode. As shown in FIG. 1, no LED light string is provided in the light string region in the fourth row and the first column, and a switching unit is coupled between a corresponding first signal line 1 in the fourth row and a corresponding second signal line 2 in the first column. The backlight driving circuit is driven line-by-line in a progressive scanning mode. When the first signal line 1 in the fourth row is gated, the switching unit is turned on, and the switching unit is equivalent to a signal source, so that the following problem can be avoided: when the LED driving chip (with a detection circuit inside) detects that no LED light string is provided in the light string region in the fourth row and the first column, in order to protect output channels of the LED driving chip, the LED light strings in the first column cannot be lighted due to open protection between the second signal line 2 in the first column and the LED driving chip when a subsequent progressive scanning is performed.

As shown in each of FIG. 1 and FIG. 2, a structural diagram of a backlight driving circuit according to some embodiments of the present disclosure is provided. The backlight driving circuit according to the embodiments not only includes the above structure, but also includes a controller, a processor, a power supply, a LED driving chip and a plurality of check switch units. A first terminal of the controller is coupled to a first terminal of the processor and configured to output a vertical synchronization control instruction. A second terminal of the controller is coupled to a second terminal of the processor and configured to output a backlight data control instruction, A third terminal of the processor is coupled to a first terminal of the LED driving chip and configured to output a frequency-multiplied vertical synchronization control instruction. A fourth terminal of the processor is coupled to a second terminal of the LED driving chip and configured to communicate with the LED driving chip. First terminals of all the check switch units are coupled to a power supply, a second terminal of each check switch unit is coupled to a corresponding first signal line 1, and control terminals of all the check switch units are coupled to a fifth terminal of the processor to control the check switch units to be turned on in a time-sharing manner. Output channels of the LED driving chip are connected to the second signal lines 2 in one-to-one correspondence.

Specifically, as shown in FIG. 1, for example, four rows and five columns of light string regions are provided. In this case, the number of the check switch units is 4, namely, Q1, Q2, Q3 and Q4. LED light strings in a same row are provided to have a common anode and are coupled together through a same first signal line 1. Four first signal lines 1 are coupled to the power supply through respective check switch units. LED light strings in a same column are provided to have a common cathode and are coupled together through a same second signal line 2. Five second signal lines 2 are coupled to five output channels of the LED driving chip in one-to-one correspondence. The controller (e.g., an upper computer) outputs a vertical synchronization control instruction (i.e., a vertical synchronization signal) through the first terminal thereof, and output a backlight data control instruction (i.e., backlight data signal) through the second terminal thereof. The processor (e.g., an MCU) analyzes and processes the received backlight data signal and vertical synchronization signal, and outputs the backlight data signal to the LED driving chip through the fourth terminal (also referred to as a communication interface) thereof, perform fourfold frequency multiplication on the vertical synchronization signal to obtain a fourfold frequency-multiplied vertical synchronization control signal, and simultaneously outputs the fourfold frequency-multiplied vertical synchronization control signal and a signal for controlling the check switch unit to be turned on.

Figure 4:
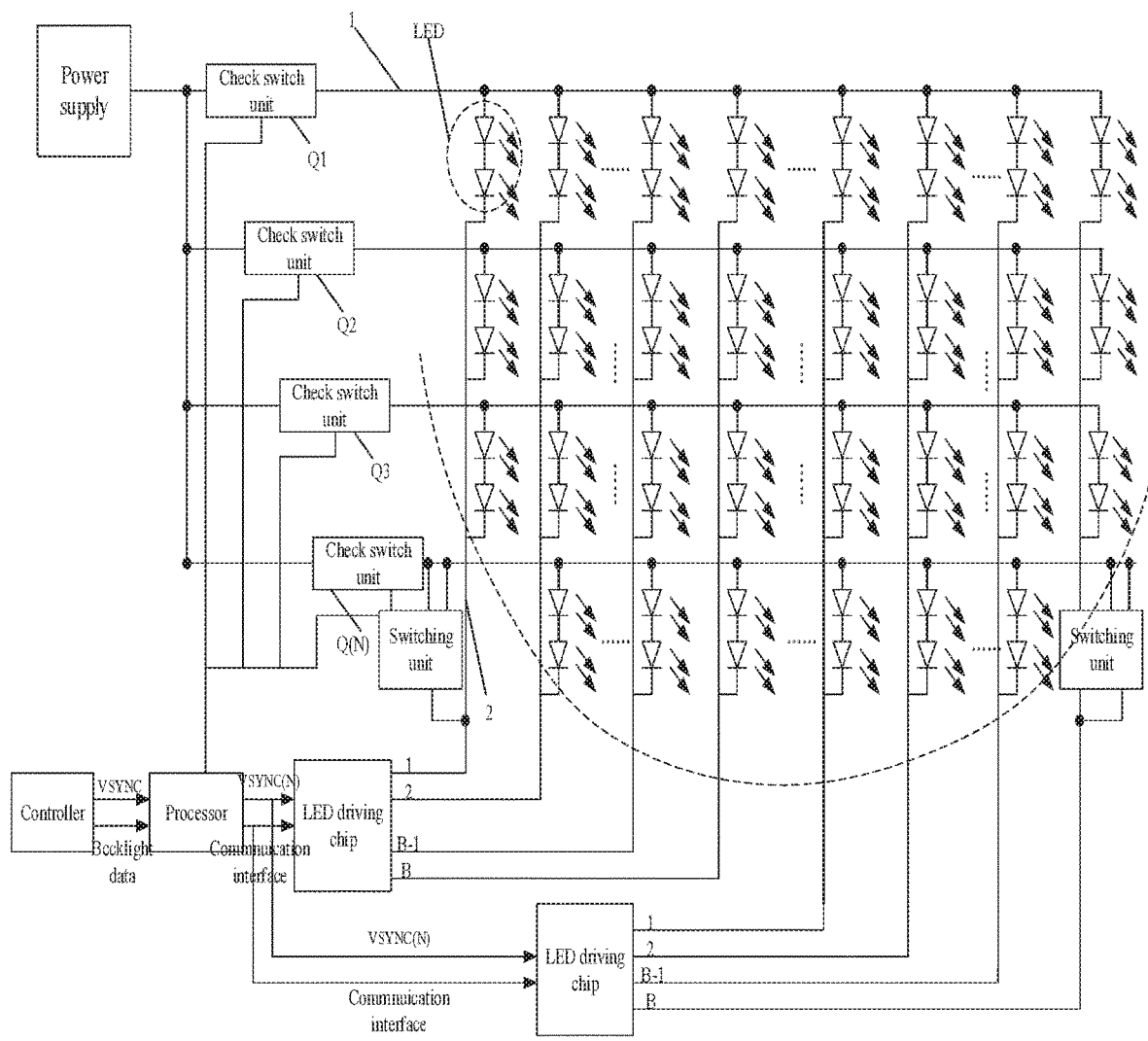
FIGS. 4 and 5 each are a schematic structural diagram of a backlight driving circuit according to some embodiments of the present disclosure.
Figure 5:
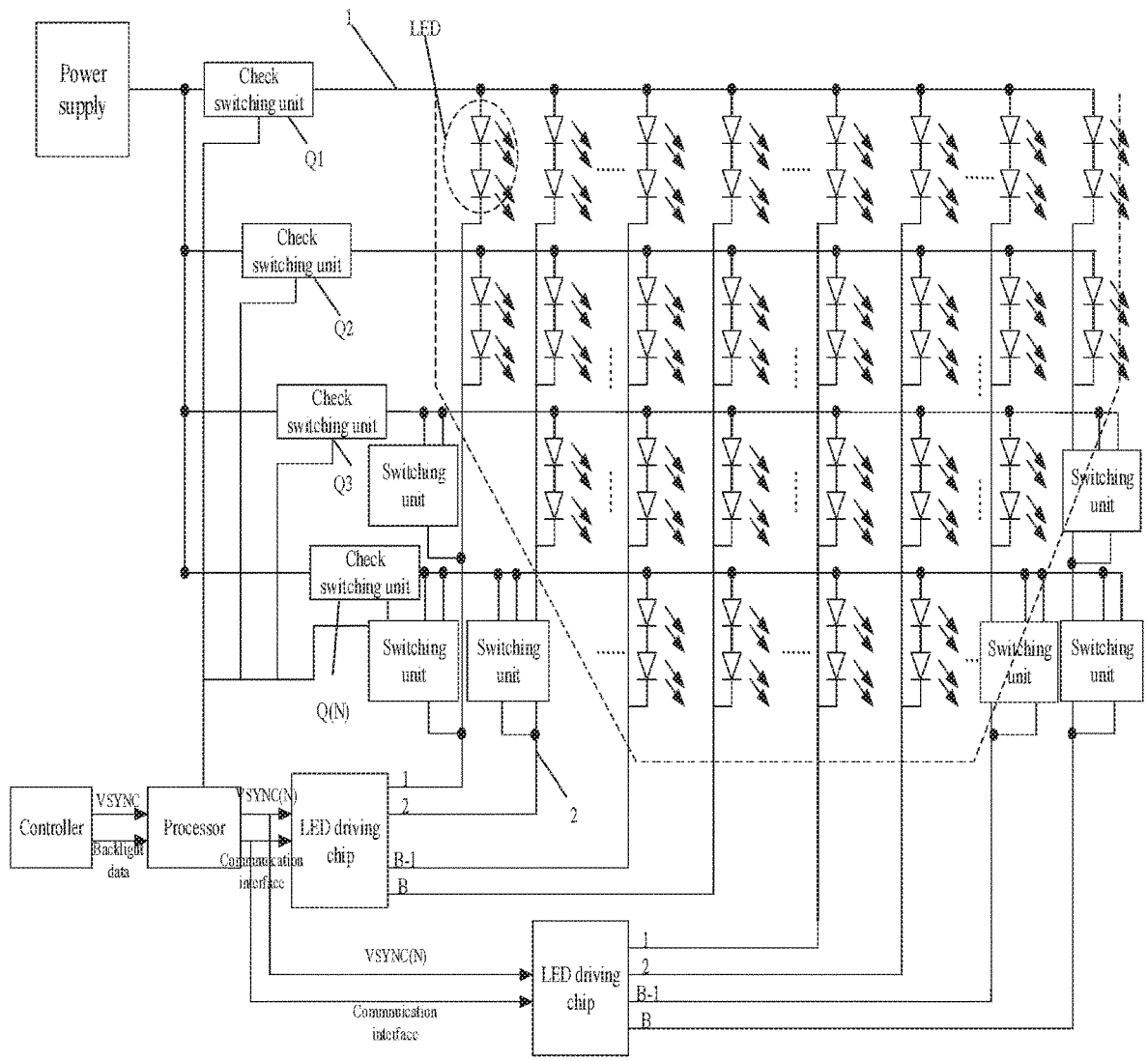

As shown in each of FIG. 4 and FIG. 5, a schematic structural diagram of a backlight driving circuit according to some embodiments of the present disclosure is provided. The backlight driving circuit can be applied in a large-sized display panel in which a plurality of LED driving chips are provided. For example, the backlight driving circuit includes N first signal lines 1 and M second signal lines 2. The backlight driving circuit is divided into A zones in the row direction, each zone including B second signal lines 2. In this case, M=A×B, where M, A, B are all positive integers; the number of the LED driving chips is A, and the number of output channels of each LED driving chip is not less than B. In this way, the second signal lines 2 in each zone are coupled to the output channels of an LED driving chip in one-to-one correspondence. It can be understood that since the backlight driving circuit includes N first signal lines 1, the number of the check switch units should also be N, and after receiving the vertical synchronization control instruction, the processor should perform N-fold frequency multiplication on the received vertical synchronization control instruction, output the N-fold frequency-multiplied vertical synchronization control instruction, and simultaneously output the N-fold frequency-multiplied vertical synchronization control instruction and a signal for controlling the check switch unit to be turned on.

Figure 6:
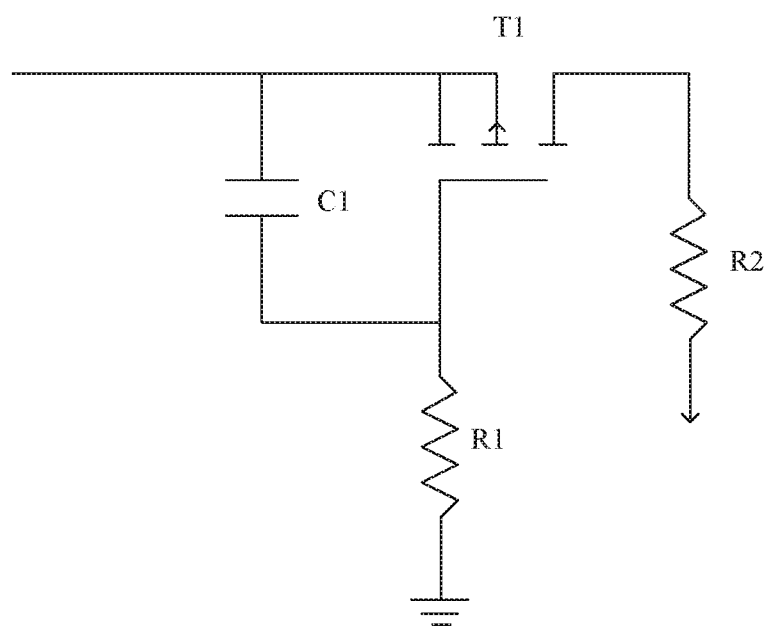
FIG. 6 is a schematic structural diagram of a switching unit of a backlight driving circuit according to some embodiments of the present disclosure.

It should be understood that, as shown in FIG. 2 and FIG. 5, when there are a plurality of light string regions without LED light strings, there are a plurality of switching units, and the light string regions without LED light strings are provided with the switching units in one-to-one correspondence. The region defined by a dotted line in each of FIGS. 1-5 corresponds to the display region (where the LED light strings are provided) in the display panel. No matter what kind of backlight driving circuit, as shown in FIG. 6, the switching unit coupled between the first signal line 1 and the second signal line 2 corresponding to the light string region without the LED light string may include: a first capacitor C1, a first switching transistor T1, a first resistor R1, and a second resistor R2. A first terminal of the first capacitor C1 is coupled to the first signal line 1 corresponding to the switching unit and a first electrode of the first switch transistor T1, and a second terminal of the first capacitor C1 is coupled to a first terminal of the first resistor R1 and a control electrode of the first switching transistor T1. A second electrode of the first switching transistor T1 is coupled to a first terminal of the second resistor R2. A second terminal of the first resistor R1 is coupled to a ground electrode. A second terminal of the second resistor R2 is coupled to the second signal line 2 corresponding to the switching unit, and therefore coupled to an output channel of the LED driving chip.

Specifically, as shown in FIG. 6, the switching unit coupled between the first signal line 1 in the fourth row and the second signal line 2 in the first column will be described as an example. The first switching transistor T1 is a P-channel MOS transistor. In this case, the first electrode of the first switching transistor T1 is a source electrode, the second electrode of the first switching transistor T1 is a drain electrode, and the control electrode of the first switching transistor T1 is a gate electrode. The source electrode of the first switching transistor T1 is coupled to an output terminal of a check switch unit Q4, the source electrode and a gate electrode of the first switching transistor T1 are coupled to both terminals of the first capacitor C1 respectively, and the gate electrode is also coupled to the ground electrode through the first resistor R1, and a drain electrode of the first switching transistor T1 is coupled to a first output channel of the LED driving chip through the second resistor R2. When the processor controls a check switch unit coupled to the signal line in the fourth row to be gated, the first capacitor C1 starts to be charged at both terminals thereof, and when the voltage between the two terminals of the first capacitor C1 reaches a switching threshold of the first switching transistor T1, the first switching transistor T1 is turned on, and at this time, a voltage signal is applied to the first channel of the LED driving chip through the second resistor R2, so that a detection of an open-circuit protection condition on the second signal line 2 in the first column by the LED driving chip causing the first channel of the LED driving chip to be turned off can be avoided.

Figure 3:
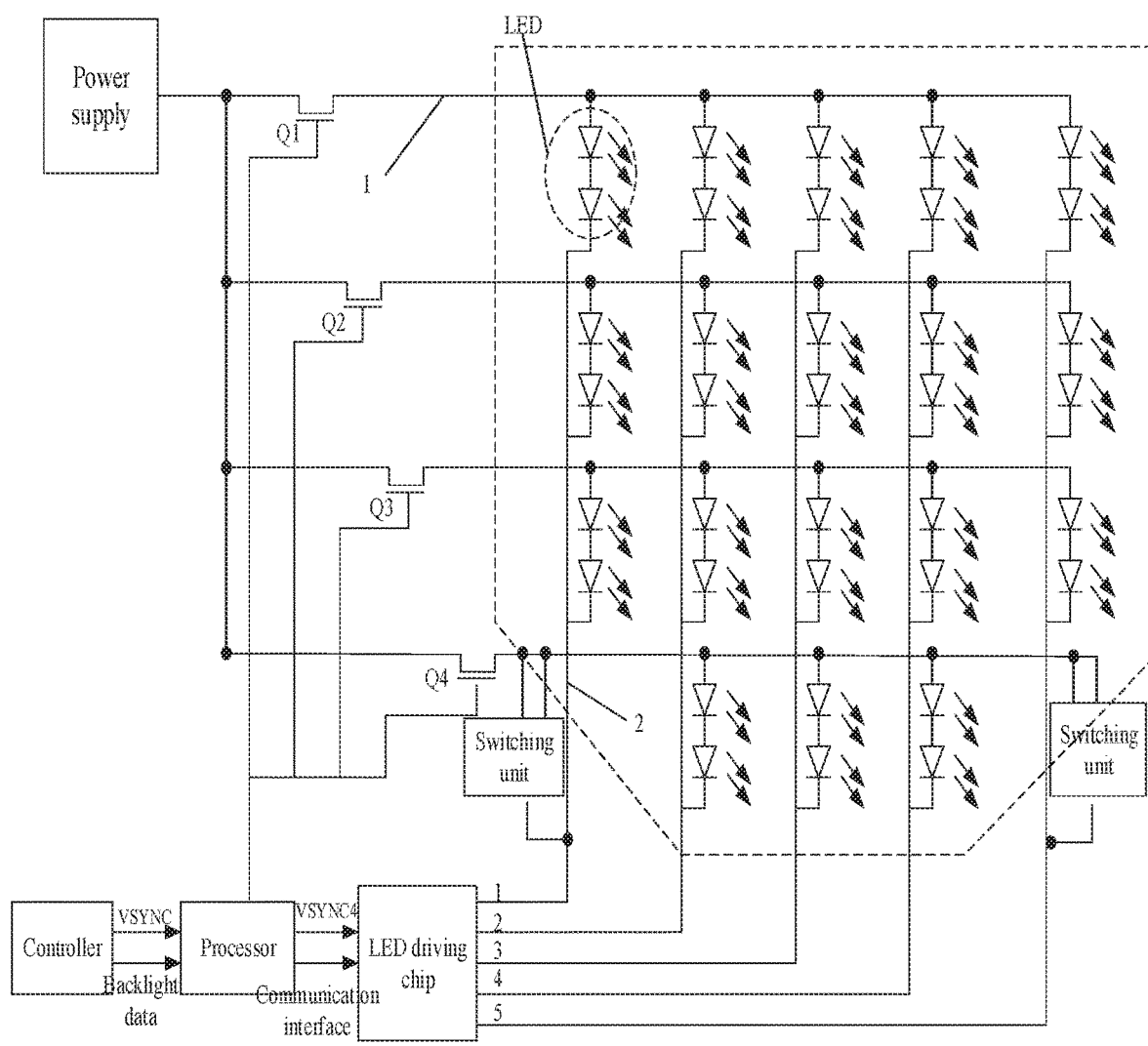
FIG. 3 is a schematic structural diagram of a backlight driving circuit in which a check switch unit in the backlight driving circuit is a second switch transistor according to some embodiments of the present disclosure.

In some embodiments, as shown in FIG. 3, the above check switch unit includes: a second switching transistor. A first electrode of the second switching transistor is coupled to the power supply, a second electrode of the second switching transistor is coupled to a corresponding first signal line 1, and a control electrode of the second switching transistor is coupled to a fifth terminal of the processor.

Specifically, when the processor controls the second switching transistor to be turned on, the power supply controls the first signal line 1 coupled to the second switching transistor to be gated, that is, the power supply provides a working voltage for an anode of the LED light string coupled to the first signal line 1. In some embodiments, the second switching transistor has same switching characteristics as the first switching transistor T1. That is, when the first switching transistor T1 is a P-type transistor, the second switching transistor is also a P-type transistor. Similarly, when the first switching transistor T1 is an N-type transistor, the second switching transistor is also an N-type transistor.

In some embodiments of the present disclosure, the processor may be a central processor; the power supply may be a DC/DC power supply. Of course, the specific type of the processor or the power supply may be selected according to specific situations.

Accordingly, in an embodiment of the present disclosure, a backlight is further provided, and the backlight includes the backlight driving circuit described above, and LED light strings provided in a part of the light string regions, and the backlight may further include an element such as an optical film.

In an embodiment of the present disclosure, the LED light string includes: a plurality of light emitting diodes (LEDs) connected in series. In the LED light string, an anode of a first LED is coupled to the first signal line 1, and a cathode of a last LED is coupled to the second signal line 2. The anodes of the first LEDs in the LED light strings in a same row are coupled to a same first signal line 1, and the cathodes of the last LEDs in the LED light strings in a same column are coupled to a same second signal line 2. In some embodiments, each LED light string includes two LEDs connected in series, the anode of one of the two LEDs is coupled to the first signal line 1, the cathode thereof is coupled to the anode of the other one of the two LEDs, and the cathode of the other one of the two LEDs is coupled to the second signal line 2. Of course, the number of LEDs in each LED light string can be selected according to the size of a specific display panel.

Accordingly, the present embodiment further provides a display device including the backlight as described above. The display device may be any product or component having a display function such as a liquid crystal panel, a mobile phone, a tablet computer, a television, a display, a notebook computer, a digital photo frame, and a navigator.

It should be understood that, the above embodiments are merely exemplary embodiments to illustrate the principles of the present disclosure, and the present disclosure is not limited thereto. It will be apparent to those skilled in the art that various modifications and improvements can be made without departing from the spirit and scope of the present disclosure, and such modifications and improvements are also considered to be within the scope of the present disclosure.

What is claimed is:

1. A backlight, comprising a backlight driving circuit, wherein the backlight driving circuit comprises a plurality of first signal lines and a plurality of second signal lines, a plurality of light string regions are defined by arranging the plurality of first signal lines and the plurality of second signal lines to cross each other, and a part of the plurality of light string regions are configured to be provided with light emitting diode (LED) light strings; and the backlight driving circuit further comprises at least one switching unit, which is provided in, among the plurality of light string regions, remaining light string regions other than the part of the plurality of light string regions provided with the LED light strings, and the at least one switching unit is coupled between a first signal line and a second signal line and configured to output a voltage signal to the second signal line coupled thereto under control of the first signal line coupled thereto.

2. The backlight of claim 1, wherein the backlight driving circuit further comprises at least one LED driving chip, and output channels of the at least one LED driving chip are coupled to the plurality of second signal lines in one-to-one correspondence.

3. The backlight of claim 2, wherein each of the at least one switching unit comprises a first capacitor, a first switching transistor, a first resistor, and a second resistor; and a first terminal of the first capacitor is coupled to the first signal line corresponding to the switching unit and a first electrode of the first switching transistor, and a second terminal of the first capacitor is coupled to a first terminal of the first resistor and a control electrode of the first switching transistor; a second electrode of the first switching transistor is coupled to a first terminal of the second resistor; a second terminal of the first resistor is coupled to a ground electrode; and a second terminal of the second resistor is coupled to the second signal line corresponding to the switching unit.

4. The backlight of claim 2, further comprising a LED light string provided in each light string region of the part of the plurality of light string regions.

5. A display device comprising the backlight of claim 2.

6. The backlight of claim 1, wherein each of the at least one switching unit comprises a first capacitor, a first switching transistor, a first resistor, and a second resistor; and a first terminal of the first capacitor is coupled to the first signal line corresponding to the switching unit and a first electrode of the first switching transistor, and a second terminal of the first capacitor is coupled to a first terminal of the first resistor and a control electrode of the first switching transistor; a second electrode of the first switching transistor is coupled to a first terminal of the second resistor; a second terminal of the first resistor is coupled to a ground electrode; and a second terminal of the second resistor is coupled to the second signal line corresponding to the switching unit.

7. The backlight of claim 6, wherein the backlight driving circuit further comprises: a controller, a processor, a power supply, and a plurality of check switch units; and a first terminal of the controller is coupled to a first terminal of the processor and configured to output a vertical synchronization control signal;

a second terminal of the controller is coupled to a second terminal of the processor and configured to output a backlight data control signal;

a third terminal of the processor is coupled to a first terminal of each of the at least one LED driving chip and configured to output a frequency-multiplied vertical synchronization control signal;

a fourth terminal of the processor is coupled to a second terminal of each of the at least one LED driving chip and configured to communicate with the at least one LED driving chip; and the plurality of check switch units are coupled to the plurality of first signal lines in one-to-one correspondence, a first terminal of each of the plurality of check switch units is coupled to the power supply, a second terminal of each of the plurality of check switch units is coupled to a first signal line corresponding to the check switch unit, and a control terminal of each of the plurality of check switch units is coupled to a fifth terminal of the processor.

8. The backlight of claim 7, wherein the backlight driving circuit comprises M second signal lines; the number of the at least one LED driving chip is A; each LED driving chip is provided with B output channels; and wherein M=A×B, each of A and B is a positive integer greater than or equal to 2.

9. A display device comprising the backlight of claim 8.

10. The backlight of claim 7, wherein each of the plurality of check switch units comprises a second switching transistor; and wherein a first electrode of the second switching transistor is coupled to the power supply, a second electrode of the second switching transistor is coupled to a first signal line coupled to the check switch unit, and a control electrode of the second switching transistor is coupled to the fifth terminal of the processor.

11. The backlight of claim 7, wherein the processor comprises a central processor.

12. The backlight of claim 7, wherein the power supply comprises a DC/DC power supply unit.

13. The backlight of claim 7, further comprising a LED light string provided in each light string region of the part of the plurality of light string regions.

14. A display device comprising the backlight of claim 7.

15. The backlight of claim 6, further comprising a LED light string provided in each light string region of the part of the plurality of light string regions.

16. A display device comprising the backlight of claim 6.

17. The backlight of claim 1, further comprising a LED light string provided in each light string region of the part of the plurality of light string regions.

18. The backlight of claim 17, wherein the first terminals of the LED light strings in a same row are coupled together via a same first signal line, and the second terminals of the LED light strings in a same column are coupled together via a same second signal line.

19. The backlight of claim 18, wherein the LED light string comprises a plurality of LEDs connected in series; and in the LED light string, an anode of a first LED of the plurality of LEDs is coupled to the first signal line as a first terminal, and a cathode of a last LED of the plurality of LEDs is coupled to the second signal line as a second terminal.

20. A display device comprising the backlight of claim 1.

* * * * *